United States Patent [19]

Criglar et al.

[11] 4,119,007

[45] Oct. 10, 1978

[54] PRESSURE TRANSDUCER FOR MUSICAL INSTRUMENTS

[76] Inventors: John J. Criglar, 111 York Dr., Piedmont, Calif. 94611; Arnold Lazarus, 39 Seward St. #3, San Francisco, Calif. 94114

[21] Appl. No.: 654,159

[22] Filed: Feb. 2, 1976

[51] Int. Cl.² ........................ G10H 3/00; H04M 1/00; H01L 1/22; H01L 10/10

[52] U.S. Cl. .................................. 84/1.14; 179/1 A;; 179/1 M; 338/4; 338/36

[58] Field of Search ............... 84/1.04, 1.14, DIG. 24, 84/12; 179/1 M, 1 A; 338/4, 36

[56] References Cited

U.S. PATENT DOCUMENTS

| | | | |
|---|---|---|---|
| 2,171,793 | 9/1939 | Huth | 338/36 |
| 2,455,501 | 12/1948 | Knight | 179/1 A |
| 3,194,870 | 7/1965 | Tondreau et al. | 84/1.16 |
| 3,439,106 | 4/1969 | Goodale | 84/1.1 |
| 3,454,703 | 7/1969 | Rose | 84/1.14 |
| 3,543,629 | 12/1970 | Barcus | 84/1.14 |
| 3,820,401 | 6/1974 | Lewis | 338/4 |

*Primary Examiner*—Edith S. Jackmon
*Attorney, Agent, or Firm*—Lindenberg, Freilich, Hornbaker, Wasserman, Rosen & Fernandez

[57] ABSTRACT

A pressure transducer comprised of a piezoresistance bridge on a semiconductor chip is employed as a pressure sensor in musical instruments having an air column through which pressure variations pass in producing sounds, such as in wind instruments and drums. A noiseless voltage preamplifier couples the transducer to a power preamplifier the output of which may then be amplified in a conventional audio amplifier. In the case of a wind instrument, the transducer is mounted between the cup or reed of the mouthpiece and the first key or finger hole, or in the air column in a direction opposite the first key or finger hole in the case of a transverse flute or similar reedless woodwind instrument for direct communication with the air column of the instrument.

7 Claims, 14 Drawing Figures

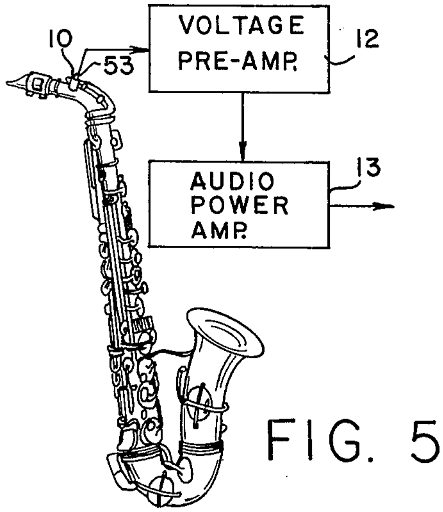
FIG. 5
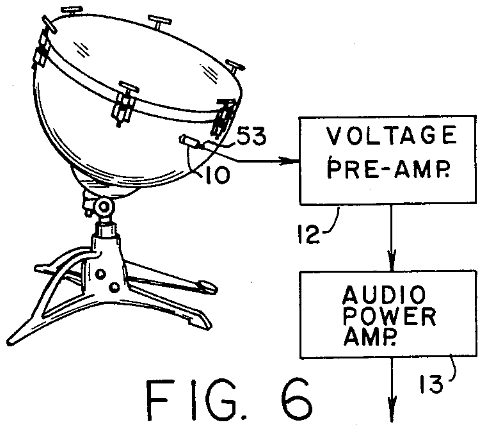
FIG. 6
FIG. 7
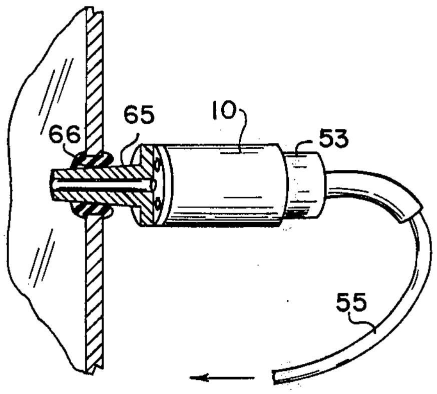
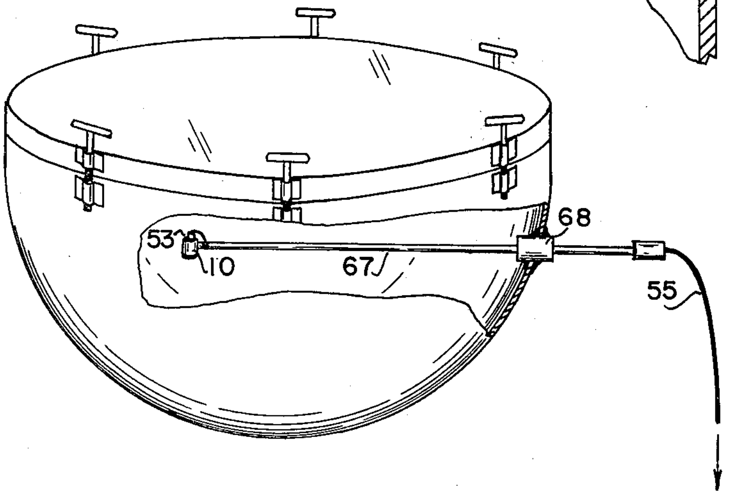
FIG. 8

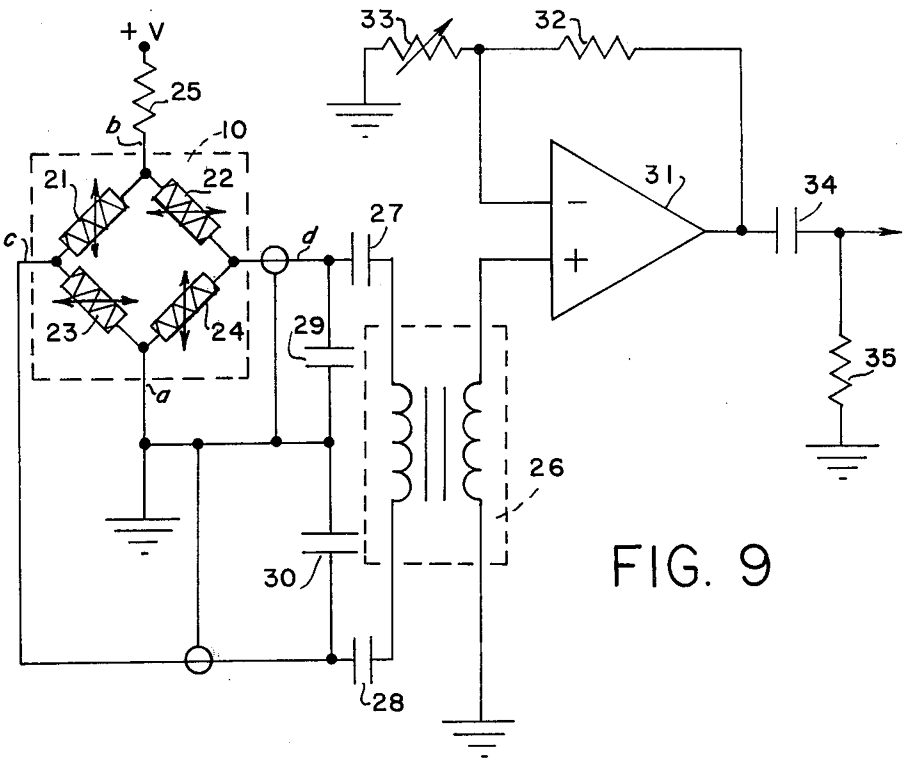
FIG. 9
FIG. 10
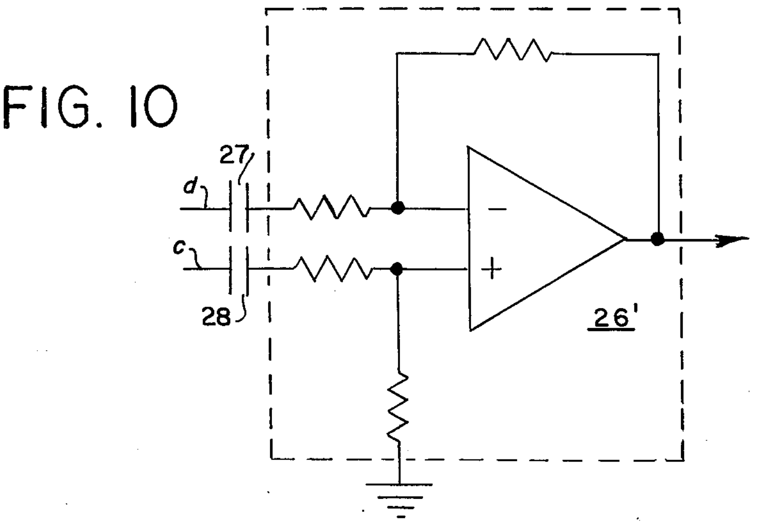

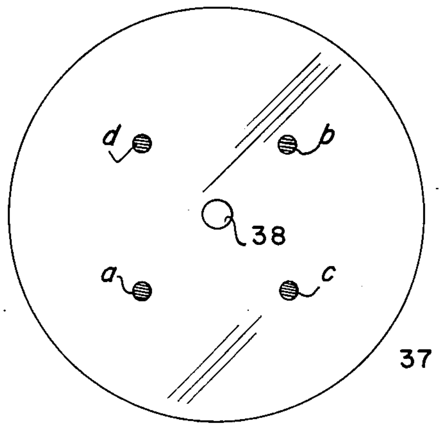
FIG. 11
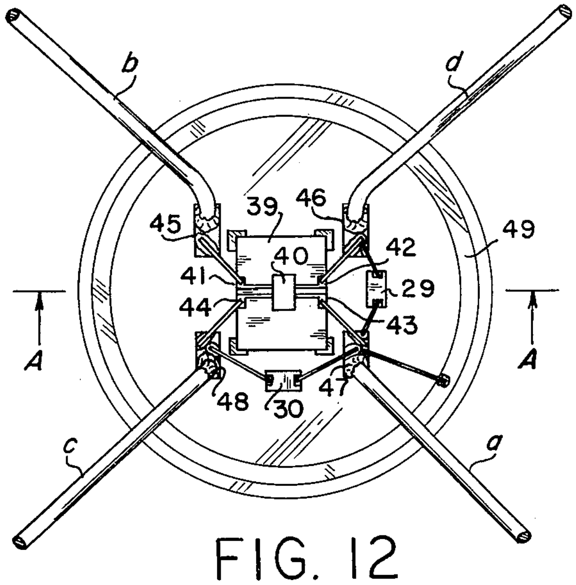
FIG. 12
FIG. 13
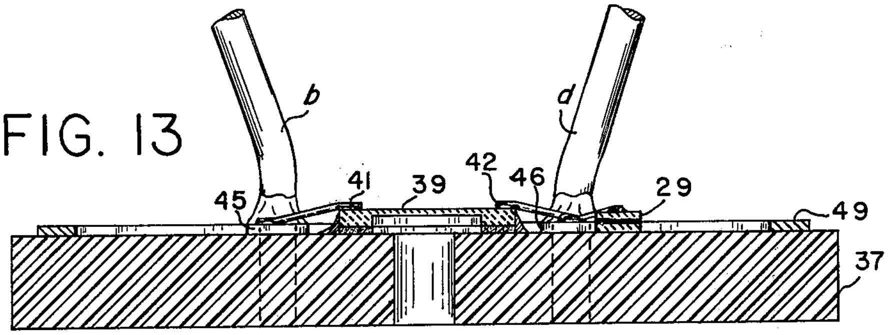
FIG. 14
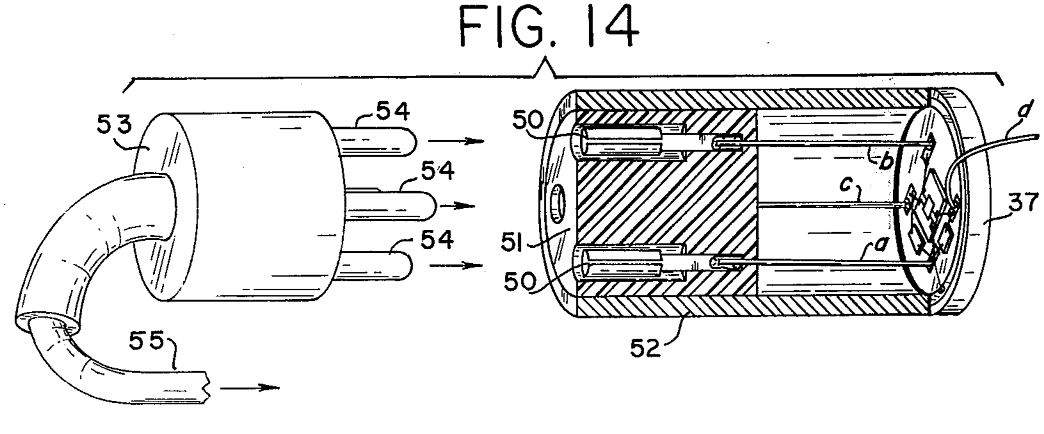

PRESSURE TRANSDUCER FOR MUSICAL INSTRUMENTS

BACKGROUND OF THE INVENTION

This invention relates to musical instruments, and more particularly to transducers for musical instruments which rely upon air pressure variations in the instrument to produce or enhance sound.

It is very often necessary to amplify the musical sound of instruments being played in a group, band or orchestra. To accomplish that, at least one microphone is placed in front to pick up the combined sound being produced. Most microphones exhibit a directivity pattern that allows picking up all of the instruments, but not all equally well. Wind instruments, such as saxophones and trumpets, are themselves highly directive. Consequently, unless the musician is in a position to play to the microphone, the sound system will fail to pick up the full quality of the tone. This is particularly critical in sound recording studios where only that which enters the microphone directly is to be recorded.

To overcome the problems of directive microphones and highly directive wind instruments, efforts have been made to use a pressure transducer of the monolithic integrated circuit type as nondirective microphones in woodwind instruments by one manufacturer of integrated circuits. The transducer itself was comprised of piezoresistors in a Wheatstone bridge prebiased by a reference cell and directly connected to a preamplifier. However, that type of transducer was only used to detect the envelope of pressure variations in a woodwind instrument for the sole purpose of modulating the risetime of the instrument's tones to emulate the "attack" of a brass instrument. A limiting microphone was reportedly coupled tightly to the instrument's bell to detect the frequency of the sounds at the output of the instrument, not their amplitudes. A modulator was then employed to modulate the frequency of the sounds with the envelope of the air pressure variations in the air column. It was not recognized that a pressure transducer in the air column of a wind instrument or drum could respond to high frequency, low amplitude variations in the air column, and thus pick up all musical sounds produced by the musician through the instrument.

SUMMARY OF THE INVENTION

According to the present invention, a pressure transducer is employed as a pressure sensor in musical instruments having an air column through which pressure variations pass in producing sounds, such as in wind instruments and drums. A noiseless voltage preamplifier couples the transducer to a power preamplifier the output of which may then be amplified in a conventional audio amplifier. In the case of a wind instrument, the transducer is mounted between the cup or reed of the mouthpiece, and the first key or finger hole, or in the air column in a direction opposite the first key or finger hole in the case of a transverse flute or similar reedless woodwind instrument for direct communication with the air column of the instrument. The transducer is preferably comprised of four piezoresistors arranged in a Wheatstone bridge arrangement on a semiconductor chip etched on the back to form a diaphragm. The etched back is bonded to a substrate to form a sealed cavity on one side of the diaphragm. Such a transducer in the air column of a musical instrument provides omnidirectional pick up with excellent fidelity in that it will not only have all of the frequencies of the sound but also their amplitude (the envelope).

The novel features that are considered characteristic of this invention are set forth with particularity in the appended claims. The invention will best be understood from the following description when read in connection with the accompanying drawings.

BRIEF DESCRIPTION OF THE DRAWINGS

FIG. 5 illustrates the present invention applied to a saxophone.

FIG. 6 illustrates the present invention applied to a kettledrum.

FIG. 7 illustrates the manner in which a pressure transducer is coupled to the air column of the drum in FIG. 6.

FIG. 8 illustrates the manner in which a pressure transducer is placed within the drum of FIG. 6 for optimum response.

FIG. 9 is a circuit diagram of one embodiment of the present invention.

FIG. 10 is a circuit diagram of a variant for the circuit of FIG. 9.

FIGS. 11 and 12 illustrate the front and back, respectively, of a piezoresistance bridge on a semiconductor chip mounted on a ceramic substrate with circuit connections to the bridge for use as a pressure transducer according to the present invention.

FIG. 13 is a sectional view taken along line A—A of FIG. 12.

FIG. 14 illustrates the structure shown in FIGS. 11–13 mounted at one end of a cylindrical housing and connected to a socket for a conventional four-prong miniature plug.

DESCRIPTION OF THE PREFERRED EMBODIMENTS

Figure 1:
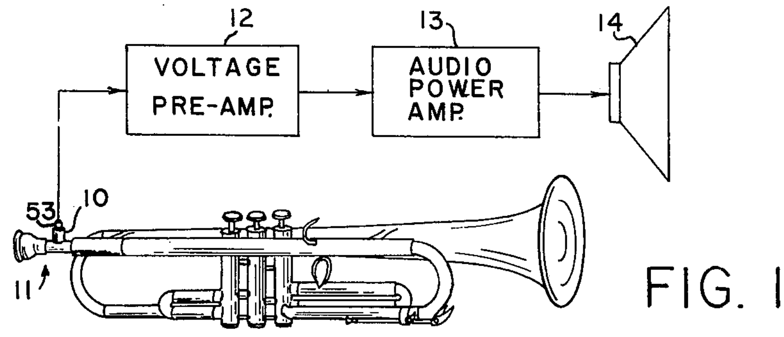
FIG. 1 illustrates the present invention applied to a trumpet.
Figure 3:
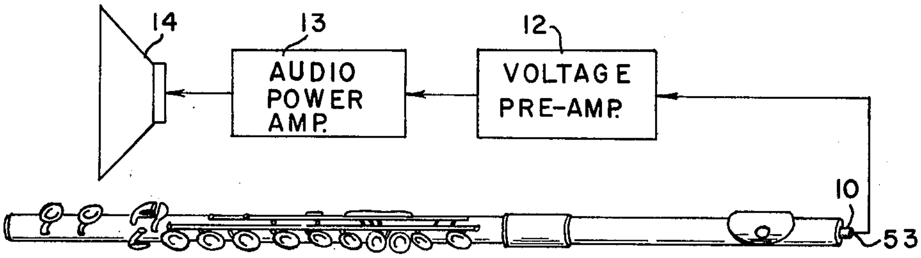
FIG. 3 illustrates the present invention applied to a transverse flute.

Referring now to the drawings, FIGS. 1, 3 and 5 illustrate the present invention as used in three typical wind instruments in the respective classes known as brass (vibrating lip mouthpiece), reedless woodwind (e.g., flute) and reed woodwind (e.g., saxaphone). However, these illustrations are by way of example only, and not by way of limitation. In practice, the present invention applies to any instrument having an air column in which pressure variations produce musical sounds, including drums, such as the kettledrum shown in FIGS. 6 and 7, and other percussion instruments, such as a xylophone with resonators (marimbas and vibraphones).

Figure 2:
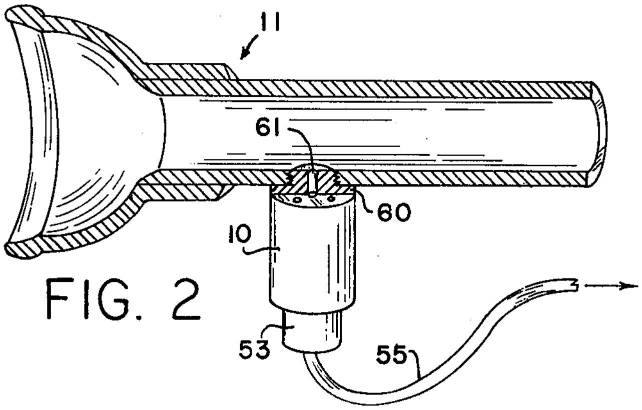
FIG. 2 illustrates the manner in which a pressure transducer is coupled to the air column of the trumpet in FIG. 1 through the wall of its mouthpiece.
Figure 4:
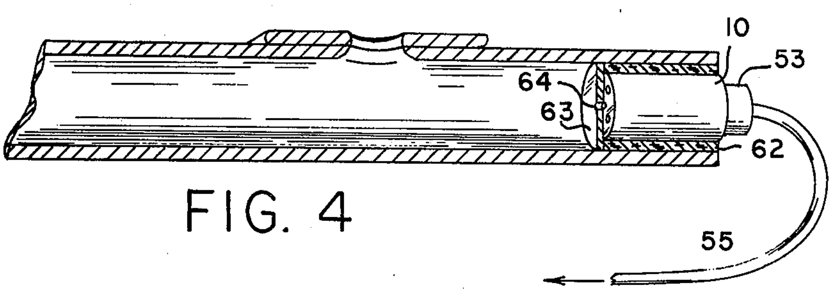
FIG. 4 illustrates the manner in which a pressure transducer is coupled to the air column of the flute in FIG. 3 through the plugged end near the mouthpiece.

According to the present invention, an undamped absolute pressure transducer 10 is coupled to the air column of the instrument through a side wall of the instrument, as in the case of the drum shown in FIGS. 6 and 7, and the saxophone shown in FIG. 5, a closed end wall as in the case of the transverse flute shown in FIGS. 3 and 4 or a wall of a mouthpiece 11 as shown for the trumpet in FIGS. 1 and 2. That type of mouthpiece is common to other brass instruments, such as a trombone. The transducer could also be mounted in the mouthpiece of a reed instrument, such as the saxophone of FIG. 5. Mounting the transducer in the mouthpiece has the obvious advantage of applying the present invention to a musical instrument without requiring any modification to the body of the instrument, although the only modification required is to provide a hole in the wall of the instrument ahead (upstream) of any means (key holes, finger holes or slide) provided for varying the resonance of the instrument. It may even be on the opposite side of the mouthpiece, as in the case of the transverse flute shown in FIG. 3.

Pressure variations over a high frequency range produce voltage variations in the transducer of the same frequencies as sounds being produced outside of the instrument, and of amplitudes linearly proportional to the amplitudes of the frequencies of those sounds. A noiseless preamplifier 12 couples the transducer 10 to a conventional audio amplifier 13 which drives a speaker 14, or system of speakers.

The preamplifier may be comprised of two stages, a first voltage amplifier stage and a second power amplifier stage. The preamplifier is preferably connected to the transducer 10 through a cable that may be typically ten feet in length. Emitter-follower amplifiers of the integrated circuit type may be employed at the transducer for impedance matching between the transducer and the cable to the preamplifier.

FIG. 9 illustrates an exemplary preamplifer circuit connected to the transducer 10. The transducer is shown schematically as four piezoresistors 21 through 24 arranged in a Wheatstone bridge configuration. DC bias voltage is applied to the bridge through a current limiting resistor 25. The bridge proper is connected to a shielded transformer 26 by capacitors 27 and 28, and is referenced to circuit ground of the Wheatstone bridge by capacitors 29 and 30.

The transformer 26 functions as a low-noise voltage amplifier for the voltage signals developed across the bridge proper by pressure variations. The secondary winding of the transformer is connected to a linear power amplifier stage comprised of an operational amplifier 31, feedback resistor 32, and gain adjusting resistor 33. A capacitor 34 and resistor 35 provide AC coupling of the voltage and power amplified signal to an audio amplifier and speaker. The sounds thus produced and amplified include only those sounds producing variations in pressure within the air column and not any mechanical sounds as might be produced by keying, for example. Consequently, the signal is free of extraneous noises, including keying noises.

Other circuit configurations for the preamplifier may, of course, occur to those skilled in the art. What is important in the present invention is that some form of AC coupling be provided between the transducer 10 and the power amplifier to eliminate any static pressure component present and couple only the dynamic pressure signals produced by musical sounds in the air column of an instrument which is closely coupled to the transducer. It would not be necessary in all cases to couple through a voltage amplifying transformer. Instead, a differential amplifier 26' connected as shown in FIG. 10 may be employed in place of the transformer as a voltage preamplifier driving a power amplifier. In both instances there is provided common mode rejection in that only the difference output of the piezoresistance bridge of the transducer is amplified.

The transducer operation is based upon strain of piezoresistors formed in a semiconductor chip, preferably a silicon chip, using techniques developed in the technology of monolithic integrated circuits. The piezoresistance effects (change of resistivity as a function of applied strain) in semiconductor material has been known since at least 1954 when C. S. Smith reported on the piezoresistance effect in germanium and silicon (Phys. Rev. 94, 42). Since then the potential of the piezoresistance effect in stress and strain transducers has been recognized. See W. G. Pfann et al, "Semiconducting Stress Transducers Utilizing the Transverse and Shear Piezoresistance Effects," J. App. Phys., 32, 2008 (1961).

Strain piezoresistance bridge sensors have been produced commercially by National Semiconductor Corporation in hybrid circuits for various static pressure measurements, and some limited acoustic applications, each of a special nature such as a microphone, and in one application, reported in an August 1974 catalog on Transducers, Pressure & Temperature, to detect only the envelope of pressure variations produced by a reed in a saxaphone. The pressure transducer coupled tightly to the instrument's reed is used to modulate frequency variations detected by a microphone coupled tightly to the bell of the instrument. The piezoresistance transducer was therefore not relied upon to pick up the pressure variations producing the sounds at the bell of the instrument. Alternately, the pressure transducer is used as a microphone coupled tightly to the instrument's reed to again modulate the output of a limiting microphone passed through a variable delay circuit. In both cases, some special effect is produced on the signal to a sound system not present. In the first case, the attack (rise time) of the tone picked up by the microphone is enhanced. In the second case, the tonal quality is selectably enhanced (made flat) or degraded (made crisp).

The present invention is not directed to producing special effects, but rather to producing amplified sound with very high fidelity and without any extraneous noise, such as the mechanical noise of a key on the instrument being operated. It has been discovered that a frequency response from 0 to 50,000 Hz can be achieved with very clear sound from any instrument having a pressure column to which the transducer can be tightly coupled when the transducer is AC coupled to a sound system through an amplifier having a flat frequency response over a sufficient range. The design of the amplifier is not per se the invention, nor is the design of the transducer, but rather the combination of the transducer tightly coupled to the air column of the instrument and AC coupled to the amplifier. Nevertheless, a preferred configuration for the transducer particularly adapted for the present invention will now be described with reference to FIGS. 11 through 14.

The transducer is comprised of a disc 37 having five openings, a center opening 38 to permit pressure variations on the face side of the transducer shown in FIG. 11 to be tightly coupled to the transducer mounted on the obverse side shown in FIG. 12, and four openings, each for receiving and holding a conductor identified by the letters, *a*, *b*, *c*, and *d* in FIGS. 12 and 9. The transducer itself is formed on a silicon chip, and more particularly, is formed on a thinned portion of the chip 39 in the center. The thinned center portion is placed over the opening 38 as shown in FIG. 13 which is a sectional view taken on the line A—A in FIG. 12. The piezoresistance bridge itself is formed within a rectangular area 40. The four junctions of the bridge are bonded to connecting pads 41–44 on the surface of the chips. The connecting pads are in turn connected by thin leads bonded to connecting pads 45–48 on the disc, and thus to leads *a, b, c* and *d.* Capacitors 29 and 30 mounted on the disc are similarly connected between leads *d* and *a,* and between leads *c* and *a,* respectively. The pads 45–48 are formed on the chips using standard metallizing techniques. At the same time a ring 49 of copper is formed and then connected to the ground lead *a* through the pad 47. To secure the chip 39 to the disc 37 before the pads 41–44 are connected to pads 45–48, silicon rubber is applied to the chip on the side which will face the obverse side of the disc, but not in the thinned center section over which the bridge is formed. Then after the chip is pressed on the disc, additional silicon rubber is applied around the edge of the chips to assure a good seal.

Once the transducer is thus formed and assembled on the disc, the leads *a, b, c* and *d* are soldered to separate receptacle connectors 50 through holes in a core 51 of insulating material. That core is placed in a position very near the disc and chip assembly, while the solder connections are made to the receptacle connectors 50. The core is then slipped to the left, as viewed in FIG. 14, over the receptacle connectors 50. Then a sleeve 52 is placed over the core 51 to hold it in a position away from the disc. A conductive cement secures the sleeve 52 to the disc 37 over the ring 49. In that manner the sleeve 52 is grounded through the ring 49 and the conductor *a.*

A conventional miniature plug 53 is provided having four prongs 54 to be inserted into the receptacle arrangement just described. A shielded cable 55 contains three insulated conductors, each connected to a prong that is to be inserted into one of the socket receptacles 50 connected to leads *b, c* and *d.* The fourth prong, connected to the grounded outer conductor of the cable, is to be inserted into the socket receptacle connected to the lead *a.* To assure that prongs of the plug are always inserted into the proper socket receptacles, the plug and socket may be "keyed," such as by having two of the prongs closer than any other two, and the socket receptacles intended to receive those two prongs similarly spaced. That is quite conventional in miniature plug and socket connectors.

Once the transducer is formed as described with reference to FIGS. 11–14, it is adapted to be tightly coupled to the air column of the instrument in which it is to be used. In the case of the trumpet shown in FIG. 1, a screw-on fitting 60 is cemented with conductive epoxy on the face of the transducer as shown in FIG. 2. The fitting has a centered passage 61 directly over the opening 38 (FIG. 11) of the transducer to provide tight coupling of the transducer in the air column of the instrument through its mouthpiece. As an alternative to the screw-on fitting, it would be possible to use a snap-on fitting, i.e., to use a fitting having a nipple slightly larger than the receiving hole in the mouthpiece instead of a fitting having a threaded nipple to be screwed into a threaded hole in the mouthpiece. In either case, the fitting is grounded via the conductive epoxy, the fitting itself may thus be made of conductive or nonconductive material without any risk of electrical shock to the musician. The same assembly may be used for fitting the transducer to the mouthpiece of a saxophone (FIG. 5) or other instruments, such as a clarinet.

For the transverse flute, the transducer is inserted into a cork cylinder 62 of slightly greater outside diameter than the inside diameter of the flute. The face of the transducer is then covered by a face plate 63. The face plate is made of nickle-silver, or silver, and secured to the face of the transducer with conductive epoxy. A centered passage is provided in the face plate to provide a tight coupling of the transducer with the air column of the instrument.

In the case of a drum, a screw-on fitting may be used, particularly in the case of the drum having a metal wall, such as the kettle drum shown in FIG. 6, as a snap-on fitting. However, a preferred fitting for a drum is one having a tapered nipple 65, shown in FIG. 7. A drum usually has a vent hole, often reinforced by a plastic or rubber grommet 66, into which the fitting may be inserted. The diameter of the vent hole may vary from drum to drum so that it is advantageous to provide a tapered nipple to fit most drums. For a drum having too large a hole, it is possible to insert a thicker grommet to reduce the size of the vent hole.

Another arrangement for providing a tight coupling of the transducer with the air column of a drum consists of inserting the entire transducer into the drum as shown in FIG. 8 using a hollow rod 67 through which the cable 55 of the transducer passes. The opening in the wall of the drum must necessarily be larger than any vent hole, but a cork or rubber sleeve 68 over the rod 67 will close the opening. The musician can slide the rod in or out to find the optimum position for the transducer. He can also rotate the rod to face the transducer in an optimum direction to receive pressure waves. In addition, he may open the drum and fasten a reflector to the rod in a position in front of the transducer. The reflector may be shaped to receive and focus pressure waves onto the transducer. A suitable shape would be that of a paraboloid. Three or four thin rods would be sufficient to secure the reflector to the end of the rod 67.

In operation, a musical instrument equipped with a pressure transducer coupled to its air column (be it a wind or woodwind instrument, or a drum) will produce musical sounds in the same manner as before it is to equipped. Those sounds are produced by the instrument as pressure variations in the air column and are picked up by the pressure transducer for amplification with a quality that surpasses that of sound picked up and amplified from outside the bell of the instrument. Keying and other outside noises are often picked up and amplified by a microphone outside the bell of the instrument. A pressure transducer coupled to the air column of the instrument is free of any outside noise, yet the transducer will produce an electrical signal having all of the frequencies of the musical sounds produced over the full range of the instrument with the amplitude of each frequency component linearly proportional to the amplitude of all other frequency components. The transducer produces an electrical signal linearly proportional to pressure variations $[(Kdp(t))/dt]$ in the air column of the instrument, where $K = [dv(t)/dp(t)]$. The sensitivity of the transducer is linear over a much wider pressure range than is obtainable with prior art transducers, i.e., the sensitivity exists over a wide frequency range (0 to 50,000Hz) even in the presence of any large static pressure.

Although particular embodiments of the invention have been described and illustrated herein, it is recognized that modifications and equivalents may readily occur to those skilled in the art. Consequently, it is intended that the claims be interpreted to cover such modifications and equivalents.

What is claimed is:

1. In a musical instrument having an air column through which pressure variations pass in producing musical sounds, and which may have a key hole used for altering the tone of musical sounds out of said instrument while in use, a pizzoresistive pressure transducer with said air column ahead of any key hole that may be present in the instrument for producing electrical signals linearly proportional to said pressure variations of musical sounds in said column produced by a musician operating the instrument, and means AC coupled to said transducer for applifying said signals, said transducer being comprised of piezoresistive elements in a Wheatstone bridge diffused on a stift diaphragm subject to direct pressure variations in said air column, and said signal amplifying means including a noiseless voltage amplifier stage coupling said transducer to a power amplifier stage comprised of a shielded transformer having primary winding connected across opposite ends of the bridge proper of said Wheatstone bridge.

2. In a musical instrument having an air column through which pressure variations pass in producing musical sounds, and which may have a key hole used for altering the tone of musical sounds out of said instrument while in use, a piezoresistive pressure transducer directly coupled with said air column ahead of any key hole that may be present in the instrument for producing electrical signals linearly proportional to said pressure variations of musical sounds in said column produced by a musician operating the instrument, and means AC coupled to said transducer for amplifying said signals, wherein said transducer is comprised of a semiconductor chip and piezoresistive elements diffused on one side of said chip, means for directly coupling one side of said chip to said air column, and a reference pressure cavity on the other side of said chip opposite the one side directly coupled to said air column for producing response to pressure variations in said air column with respect to pressure in said cavity.

3. The combination of claim 2 wherein said elements consist of four piezoresistors arranged in a Wheatstone bridge configuration on said chip.

4. The combination of claim 3 wherein said signal amplifying means includes a noiseless voltage amplifier stage coupling said transducer to a power amplifier stage.

5. The combination of claim 4 wherein said voltage amplifier stage is comprised of a shielded transformer having opposing ends of its primary winding connected to opposite ends of the bridge proper of said Wheatstone bridge.

6. The combination of claim 5 wherein said instrument includes a wall having a hole and said transducer is placed in direct communication with said air column through said hole in the wall of said instrument.

7. The combination of claim 5 wherein said instrument includes a mouthpiece having a hole and said transducer is placed in direct communication with said air column through said hole in the wall of said mouthpiece.

* * * * *